United States Patent
Toyama et al.

(10) Patent No.: US 6,660,931 B2
(45) Date of Patent: Dec. 9, 2003

(54) SUBSTRATE FOR SOLAR CELL, SOLAR CELL HAVING THE SAME, AND PRODUCTION PROCESS OF SOLAR CELL

(75) Inventors: Noboru Toyama, Osaka (JP); Yuichi Sonoda, Nara (JP); Yusuke Miyamoto, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/208,868

(22) Filed: Aug. 1, 2002

(65) Prior Publication Data

US 2003/0019519 A1 Jan. 30, 2003

Related U.S. Application Data

(63) Continuation of application No. PCT/JP01/10581, filed on Dec. 4, 2001.

(30) Foreign Application Priority Data

| Dec. 4, 2000 | (JP) | ........................... 2000-367986 |
| Dec. 3, 2001 | (JP) | ........................... 2001-368243 |

(51) Int. Cl.$^7$ ..................... H01L 31/0224; H01L 31/18; H01L 31/04; C23C 16/40
(52) U.S. Cl. ..................... 136/256; 136/265; 136/252; 257/43; 257/431; 257/432; 438/85; 438/98; 438/69; 438/72; 428/701; 427/74; 204/192.29; 205/199; 205/333
(58) Field of Search ............... 136/265, 256, 136/252; 257/43, 431, 432; 438/85, 98, 69, 72; 428/701; 427/74; 204/192.29; 205/199, 333

(56) References Cited

U.S. PATENT DOCUMENTS

| 5,486,238 A | 1/1996 | Nakagawa et al. ......... 136/259 |
| 5,770,463 A | 6/1998 | Nakagawa et al. ........... 438/62 |
| 5,804,466 A | 9/1998 | Arao et al. .................... 438/95 |
| 6,133,061 A | * 10/2000 | Sonoda ....................... 438/69 |
| 6,136,162 A | * 10/2000 | Shiozaki et al. ........ 204/192.29 |
| 6,346,184 B1 | * 2/2002 | Sano et al. .................. 205/199 |

FOREIGN PATENT DOCUMENTS

| EP | 0 558 881 A2 | | 9/1993 |
| EP | 0 794 270 A1 | | 9/1997 |
| EP | 0 890 995 A2 | | 1/1999 |
| JP | 61-64874 | | 4/1986 |
| JP | 10-140373 | | 5/1998 |
| JP | 10-313127 A | * | 11/1998 |
| JP | 11-302896 | | 11/1999 |
| JP | 2000-199097 | | 7/2000 |
| JP | 2001-152390 A | * | 6/2001 |
| WO | WO-02/47175 A2 | * | 6/2002 |

OTHER PUBLICATIONS

"Textured Zno: Al Films For Solar Cells By DC–Magnetron Sputtering In Water Vapor Plasma," Tokio Nakada, et al., Dept. of Electrical Engineering and Electronics, Aoyama Gakuin University, Setagaya–ku, Tokyo 157, Japan, (1991), pp. 1389–1392.

"Large–Area Zno Films Grown By Photo–MOCVD And Their Application To a–Si Solar Cells," Wilson W. Wenas, et al., Dept. of Electrical and Electronic Engineering, Tokyo Institute of Technology. (1993), pp. 935–940.

* cited by examiner

*Primary Examiner*—Alan Diamond
(74) *Attorney, Agent, or Firm*—Fitzpatrick, Cella, Harper & Scinto

(57) ABSTRACT

A substrate for a solar cell is provided which comprises a support having a metal surface and a zinc oxide film formed on the metal surface and having a water content of $7.5 \times 10^{-3}$ mol/cm$^3$ or less, preferably $4.0 \times 10^{-4}$ mol/cm$^3$ or more. Thereby, the increase of series resistance and the generation of shunt are prevented and the efficiency such as Jsc and the chemical stability are improved, thus obtaining a solar cell with a zinc oxide film having optimal overall characteristics.

9 Claims, No Drawings

SUBSTRATE FOR SOLAR CELL, SOLAR CELL HAVING THE SAME, AND PRODUCTION PROCESS OF SOLAR CELL

This application is a continuation of International Application No. PCT/JP01/10581, filed Dec. 4, 2001, published in English as International Publication Number WO 02/47175 A2 on Jun. 13, 2002, which claims the benefit of Japanese Patent Application Nos. 367986/2000, filed Dec. 4, 2000, 368243/2001 filed Dec. 3, 2001.

BACKGROUND OF THE INVENTION

1. Field of the Invention

The present invention relates to a substrate for a solar cell with a metal surface having formed thereon a zinc oxide film containing water in a prescribed amount or lower, a solar cell, and a production process of a solar cell.

2. Related Background Art

As a method for forming an oxide thin film by a vacuum process, well-known are an evaporation method, a sputtering method, a CVD method and the like. In the case of forming an oxide thin film by these methods, water adhering to the walls of a vacuum furnace is possibly taken into the film. However, any prior technique has not been described ever regarding the water content in a film in such a case.

Regarding the method for forming an oxide by intentionally introducing water molecules in the vacuum process, a relevant description is described in Japanese Patent Application Laid-Open No. 61-64874 document. According to the document, there is description that an oxide is deposited using argon gas mixed with water vapor as a sputtering gas, however the document has no particular description referring to the water content in the oxide film after deposition.

In place of the vacuum process, some methods (electrodeposition methods) for depositing oxide utilizing electrochemical reactions of aqueous solutions have been disclosed. For example, Japanese Patent Application Laid-Open No. 11-302896, titled, "production method of an oxide thin film" discloses a method of producing an objective oxide by depositing a hydrate, a hydroxide, or a water-containing substance containing metal species a support and then changing the duty ratio of pulses of applied voltage to dehydrate while suppressing the dissolution. Here, existence of water in any form in the oxide deposited by the electrodeposition method is disclosed as a conventional technique. Further, there is also a description that dehydration is needed since the existence of water or the like deteriorates the reliability of the film. However, there is no description at all regarding the amount of the water contained in the objective oxide.

Further, Japanese Patent Application Laid-Open No. 10-140373 document discloses a method (an electrodeposition method) of forming a zinc oxide thin film on a support by applying an electric current in an aqueous solution produced by adding a carbohydrate to an aqueous solution containing nitrate ions and zinc ions. However, no description is given regarding the amount of water contained in the zinc oxide thin film.

Presuming that the usability of a substrate for solar cells depends on the amount of water contained in an oxide thin film, the present inventors have made an investigation of a zinc oxide film formed by a sputtering method, an investigation of a zinc oxide thin film involving water vapor introduction by a sputtering method, and an investigation of a zinc oxide film by deposition from an aqueous solution by an electrodeposition method.

As a result, in the case of a zinc oxide film produced by deposition from an aqueous solution by an electrodeposition method, it has been found that the electric resistance value of the film is not constant. Although the reason for that is not clear, when the resistance is changed by two or more orders of magnitude and becomes high, the initial characteristics of solar cells are deteriorated.

Also, in the case of making the surface area large in terms of industrial productivity, the uniformity, the adhesion and the like are sometimes insufficient.

SUMMARY OF THE INVENTION

The present invention has been accomplished in view of the above mentioned situation, and it is, therefore, an object of the present invention to provide a substrate for a solar cell having a zinc oxide film with optimal overall characteristic and a solar cell using the substrate.

According to a first aspect of the present invention, there is provided a substrate for a solar cell comprising a support having a metal surface and a zinc oxide film formed on the metal surface and having a water content of $7.5 \times 10^{-3}$ mol/cm$^3$ or less.

In the present invention, it is preferable that the zinc oxide film has a water content of $4.0 \times 10^{-4}$ mol/cm$^3$ or more and more preferable that the film has a water content of not less than $1.0 \times 10^{-3}$ mol/cm$^3$ and not more than $5.0 \times 10^{-3}$ mol/cm$^3$.

Further, it is preferable that the zinc oxide film is formed by electrodeposition utilizing an electrochemical reaction in an aqueous solution.

Moreover, it is preferable that the zinc oxide film is formed by sputtering in an atmosphere comprising water.

Also, it is preferable that the zinc oxide film is comprised of a plurality of layers.

In addition, it is preferable that the metal surface of the support comprises a metal selected from the group consisting of silver, aluminum, copper, silver alloy, aluminum alloy, and copper alloy.

According to a second aspect of the present invention, there is provided a process of producing a solar cell comprising the steps of:

forming a zinc oxide film on a support using an aqueous solution;

drying the zinc oxide film at a first temperature; and forming a semiconductor layer on the zinc oxide film at a second temperature that is not higher than a temperature which is higher by 100° C. than the first temperature. Incidentally, when a layer such as another semiconductor layer is further formed on the above-mentioned semiconductor layer, there is no restriction as to the formation temperature of the further formed layer (i.e., the layer which is not in contact with the zinc oxide film).

In the present invention, it is preferable that the second temperature is not higher than the first temperature.

Further, it is preferable that the first temperature is not lower than 200° C. and not higher than 400° C.

Presuming that problems in the above-described substrate for solar cells having a zinc oxide thin film significantly depends on the water content in the zinc oxide thin film, the inventors have carried out the following experiments.

Measurement of Water Content and Correlation of Water Content with Resistance and Reflectivity A silver film with a thickness of 800 nm and successively a zinc oxide thin film with a thickness of 1 μm were formed on a SUS 430 (2D surface) support at a set temperature of 200° C. in argon atmosphere by a commercially available sputtering apparatus (manufactured by ULVAC, Inc.) (sample A).

Next, after a silver film was formed in the same conditions, the partial pressure of water was changed to be 5, 10, 15, and 30% and a zinc oxide thin film with a thickness of 1 μm was formed (samples B to E). Further, the partial pressure of water was changed to be 0.1% and a zinc oxide thin film with a thickness of 1 μm was formed (sample L).

Further, using a support on which a silver film was formed in the above-described conditions as a cathode and a zinc plate as an anode, a zinc oxide film with a thickness of 1 μm was formed on the silver by an electrodeposition method in an aqueous zinc nitrate solution (sample F). Moreover, same samples F were dried under some different drying conditions to obtain samples (sample G to K).

In such a manner, several sheets of each samples were produced and their water contents were measured by Karl Fisher Moisture Titrator (MKC-510, manufactured by Kyoto Electronics).

Further, metals of Cr and successively Au, were evaporated on the zinc oxide thin film of each sample by a vacuum evaporation apparatus using a 0.25 $cm^2$ mask and used as an upper electrode to measure the electric resistance value between the upper electrode and the SUS support. Since the measurement system including the measurement probe itself has the circuit resistance of about 0.1 $\Omega cm^2$, the electric resistance measurement was supposed to include measurement error to the extent of such a level.

Further, the total reflectivity and the irregular reflectivity of each sample were measured by a spectrometer (V-570, manufactured by JASCO Corporation Ltd.) in a range of 400 nm to 1,200 nm.

The measurement results (i.e., the relationship between the water content and the electrical resistance and reflectivity of zinc oxide thin films formed under various film forming conditions) are shown in Table 1. The water contents were determined by measuring the water amount per 8 $cm^2$ of the substrate surface of a zinc oxide thin film and calculated the amount of water contained in the thin film ($cm^3$) and expressed in number by mole. The values of the electric resistance were the values without correction containing the above-described error. The total reflectivity and the irregular reflectivity were the values measured at 800 nm wavelength. When the measurement results fluctuated, average values were calculated by drawing a curve contacting the hills and a curve contacting the valleys in the above-mentioned wavelength range and averaging the value of the curve contacting the hills and the value of the curve contacting the valleys at 800 nm wavelength and the thus obtained average values were used as the total reflectivity and the irregular reflectivity values.

Some facts are understood from Table 1. At first, in the case of the sample A produced by sputtering without water, the film after film formation was supposed to contain water although no water was introduced. That is, the water contained is probably attributed to the intake of the water adsorbed to the walls of a vacuum furnace and the water adsorbed to the thin film surface from the atmospheric air during the time until the water content measurement.

In the case of samples B to E for which water was added during the sputtering, it was found that the amounts of water taken into the zinc oxide thin films were increased stepwise, although slightly.

As compared with samples produced by sputtering, the sample F produced by the electrodeposition method (without drying) contained at least 10 times amount of water. The samples F to K produced by the electrodeposition method were found that the water content in the zinc oxide thin films could optionally be adjusted by changing the drying temperature and the drying time. In this case, the water content was decreased from the sample F to the sample J.

Regarding the reflectivity of each sample, the total reflectivity scarcely differed, whereas the irregular reflectivity increased with the increase of the water content and the irregular reflectivity reached 77 to 79% with the water content of approximately $1 \times 10^{-3}$ mol/$cm^3$. The increase of the irregular reflectivity was supposedly attributed to that the transparency of a zinc oxide film was increased by oxygen (oxygen supposedly in form of water molecules and oxygen produced by decomposition of water during the film formation in the case of the sputtering method and oxygen supposedly almost all in form of water molecules in the case of the electrodeposition method) taken into the zinc oxide films during the film formation and that the morphology of the surface of the zinc oxide thin films was changed in the direction of proceed of surface unevenness due to water intake although the reason was unclear.

As a substrate for solar cells, the higher the irregular reflectivity is, the more Jsc is expected to be improved owing to the optical confinement effect. In the case of using silver for a metal layer on the substrate surface so as the case of the experiments, the optical confinement effect can be expected to be satisfactory when the irregular reflectivity is 70% or higher, in the case of samples containing a more amount of water, the Jsc is expected to be improved more owing to such an effect.

With the increase of the water content in a zinc oxide thin film, the value of the electric resistance is generally increased a little by a little. In the case of using the thin film for solar cells, those having electric resistance to a certain extent hardly cause shunt, so that the thin film is better to have a slight electric resistance rather than having no resistance. Especially, from a viewpoint that shunt hardly takes place under high temperature and high humidity environments, a remarkable effect can be expected.

However, in the case of the samples F and G, the values of the electric resistance were extremely high and if they are used as substrates for solar cells, the series resistance of the solar cells is possibly increased and the initial characteristics are probably considerably deteriorated. The upper limit values of the electric resistance are approximately 3.0 to 3.4 $\Omega cm^2$, which are of the sample H. For that, the water contents of the zinc oxide thin films are preferably $0.75 \times 10^{-2}$ mol/$cm^3$.

Heating in Reducing Atmosphere

After the sample A, the sample D, the sample J and the sample L shown in Table 1 were heated at 400° C. for 30 minutes at 133 Pa (1 Torr) in hydrogen atmosphere in a vacuum furnace, they were taken out and the surface was observed with eyes. The sample D and the sample J were found unchanged before and after heating, whereas the sample A was found blackened in the zinc oxide thin film surface after heating. Further, as to the sample L, there were cases where the sample looked slightly blackened after heating. Although these were supposed to be used as solar cells without any problems, those containing more water were found more stable in the reducing atmosphere. That is, in the cases of the sample D, the sample J and the sample L containing a certain amount of water, practically $4.0 \times 10^{-4}$ mol/cm$^3$ or higher, since the zinc oxide thin films were slightly oxygen-rich in relation to zinc, they are supposed to be chemically stable even in the reducing atmospheric conditions similar to these in the case of producing the solar cells (semiconductor films) on substrates and the optical properties are supposedly not deteriorated.

Observation by Electron Microscope

The zinc oxide thin film surfaces of the sample A, the sample B, the sample D, and the sample J shown in Table 1 were observed by an electron microscope. The unevenness of the surfaces was found increasing a little by a little with increase of the water content. Especially, regarding the sample J, as compared with other samples, the unevenness increased in a proceeding manner. That is, owing to the water content to a certain extent or more, those just like grain boundaries attributed to more water existing in the sample than in zinc oxide thin films produced by the vacuum process such as common sputtering, so that the film of the sample seemed to form a rugged shape seemingly composed of rocks laying. For that, a high irregular reflectivity was obtained and owing to the optical confinement effect, the Jsc improvement was more highly expected.

Cross Hatch Test/Cross Cut Tape Test

Only a zinc oxide thin film was formed on the sample A in the same manner as that of the sample J to give a sample M and a cross hatch test (JIS standardized) was carried out for the sample M and the sample J. The test results were 10 points for the sample M and 8 points for the sample J.

The experiments described above made the following clear: that the unevenness of the surface of the zinc oxide thin film proceeded and the irregular reflectivity increased with the increase of the content of water in the film. Further, with the increase of the water content in the zinc oxide thin film, the electric resistance increased a little b a little and thus the effect of making shunt difficult to take place could be expected. However, in the case the water content in a film was too high, the electric resistance was unstable or became high and thus the film was unsuitable for a substrate for solar cells.

Further, in terms of the adhesion, a double layer structure was more excellent than a single layer structure.

The inventors have completed the invention with the constitution as described above as a result of the enthusiastic investigations carried out to achieve the above described purposes, based on the above results of the experiments.

From the above-mentioned results, the water content of the zinc oxide film is preferably $7.5 \times 10^{-3}$ mol/cm$^3$ or less, and more preferably $4.0 \times 10^{-4}$ mol/cm$^3$ or more and $7.5 \times 10^{-3}$ mol/cm$^3$ or less. Further, from the viewpoint of attaining a low resistivity and a high irregular reflectivity, it is preferable that the water content of the zinc oxide film is not less than $1.0 \times 10^{-3}$ mol/cm$^3$ and not more than $5.0 \times 10^{-3}$ mol/cm$^3$.

DESCRIPTION OF THE PREFERRED EMBODIMENTS

The following is the description of the support having a metal surface and an electrodeposition method to be employed for the embodiments of the invention.

Support Having Metal Surface

Materials having a high optical reflectivity in the zinc oxide thin film forming surface are suitable for the support material to be employed for the invention. Further, in electrochemical deposition of zinc oxide film, many materials may be used as long as they have a metal surface which is capable of attaining electric conduction with the zinc oxide thin film forming surface and which is not corroded in an electrodeposition bath within a short time, and metallic materials such as SUS, Ag, Al, Cu, Fe and alloys thereof may be used. PET films coated with a metal are also usable. From these points of view, to be employed as a support for solar cells, those having silver, aluminum, copper, a silver alloy, an aluminum alloy, or a copper alloy in the zinc oxide thin film forming surface are especially excellent. Further, in consideration of the industrial productivity with surface area enlargement, in order to carry out device fabrication process in the succeeding steps, those produced by depositing silver, aluminum, copper, a silver alloy, an aluminum alloy, or a copper alloy on a long substrate made of a SUS are excellent.

A non-magnetic SUS and a magnetic SUS are both usable as the SUS. The typical example of the former is SUS 304, which is excellent in polishing property and is possible to have a mirror face of about 0.1 s. The typical example of the later is SUS 430, a ferrite type steel.

The surface of the SUS material may be smooth or roughened. The surface property is changed depending on the types of rolling rollers used in the rolling process of the SUS material. Those called as BA have an almost mirror face, while unevenness is remarkable in those called as 2D. In any surface, when observed with an SEM (scanning electron microscope), recesses with a size of a micrometer level are sometimes found significant. As a substrate for solar cells, rather than large undulation-like unevenness, a structure with a size of a micrometer level influences the characteristics of solar cells in both good and bad aspects.

The surface of silver, aluminum, copper, a silver alloy, an aluminum alloy, or a copper alloy may be smooth or roughened. As a substrate for a solar cells, when the surface has a proper unevenness structure of a micrometer level, the irregular reflectivity is expected to be improved. However, when the unevenness structure is too remarkable, the Voc of solar cells may sometimes be decreased or shunt may sometimes be induced, so that careful control is required. Further, when the metal surface is smooth, the unevenness, the shape, or the like is changed with an zinc oxide film, so that the irregular reflectivity is expected to be improved similarly to that described above. In this case also, if the roughened structure is too remarkable, the Voc of solar cells may sometimes be decreased or shunt may sometimes be induced, so that careful control is required.

Electrodeposition

A corrosion resistant container such as a beaker is filled with an aqueous electrodeposition solution and while the solution being stirring by a magnetic stirrer, a support having a metal surface is used as a cathode and a counter electrode is used as an anode and a DC power source is connected and a voltage is applied to the electrodes to form a zinc oxide thin film on the cathode.

The aqueous electrodeposition solution is an aqueous solution containing at least nitrate ions and zinc ions, and the concentration is preferably 0.002 mol/L (or mol/l) to 3.0 mol/L and more preferably 0.01 mol/L to 1.5 mol/L, and most preferably 0.05 mol/L to 0.7 mol/L. In such a manner, a zinc oxide thin film with a texture structure suitable for exhibiting the optical confinement effect can efficiently be formed.

Further, when saccharose or dextrin is added to the aqueous solution, the additive works so as to optimize the electrodeposition reaction to suppress abnormal growth of a zinc oxide thin film, so that the uniformity of the film forming surface can be kept excellent. In such a manner, a zinc oxide thin film with a texture structure and highly effective in the optical confinement effect can be formed at a high production yield. In the case of adding saccharose or dextrin as mentioned above, the concentration of saccharose is preferably 1 g/L to 500 g/L and more preferably 3 g/L to 100 g/L and the concentration of dextrin is preferably 0.01 g/L to 10 g/L and more preferably 0.025 g/L to 1 g/L.

The electric current to be applied between the support and the counter electrode is preferably $0.1$ $mA/cm^2$ to $100$ $mA/cm^2$ and more preferably $1$ $mA/cm^2$ to $30$ $mA/cm^2$ and most preferably $4$ $mA/cm^2$ to $20$ $mA/cm^2$.

Further, the pH of the solution is controlled to be 3 or more, the electric conductivity to be 10 mS/cm or more, and the solution temperature to be 60° C. or more, so that a uniform zinc oxide thin film can efficiently be formed with scarce abnormal growth.

EXAMPLES

Example 1

A 0.15 mm-thick SUS 430 (with 2D surface) sheet was cut into 5 cm-square pieces. A 800 nm-thick silver film was formed on each piece at 350° C. and a constant electric current of 0.3 A in argon atmosphere of 0.399 Pa (3.0 mTorr) by a sputtering apparatus (SBH-2206DE, manufactured by ULVAC).

Next, an aqueous solution containing 0.2 mole of zinc nitrate and 0.1 g of dextrin dissolved in 1 litter of pure water was put in a beaker and heated to 82° C. Using each SUS/silver support produced by the sputtering as a cathode and a 5 cm-square zinc plate with 4N-purity as an anode, a DC electric current of 180 mA was applied in a constant current mode to form a 1.2 µm-thick zinc oxide thin film on each SUS/silver support. The distance between the support and the anode was set to be 2 cm. During the film formation, the aqueous solution was stirred by a magnetic stirrer.

Each sample obtained in such a manner was set in a portable electric furnace (AFM-10, manufactured by Asahi Rika Manufacturing), heated at a set temperature of 300° C. for 10 seconds, taken out, and subjected to water content measurement by a Karl Fisher Moisture Titrator (MKC-510, manufactured by Kyoto Electronics).

Further, using a 0.25 $cm^2$ mask, metals of Cr and successively Au, were evaporated on the zinc oxide thin film by a vacuum evaporation apparatus to form an upper electrode and the electric resistance between the upper electrode and the SUS support was measured. Since the measurement system including the measurement probe itself had the circuit resistance of about 0.1 $\Omega cm^2$, the electric resistance measurement was supposed to include an measurement error to the extent of such a level.

Further, the total reflectivity and the irregular reflectivity of each sample were measured by a spectrometer (V-570, manufactured by JASCO Corporation Ltd.) in a range of 400 nm to 1,200 nm.

The water contents were determined by measuring the water amount per 8 $cm^2$ of the substrate surface of the zinc oxide film and calculated the amount of water contained in 1 $cm^3$ of the zinc oxide film and expressed in number by mole. The value of the electric resistance of each sample was the value without correction containing the above-described error. Since the measurement results of the total reflectivity and the irregular reflectivity fluctuated, average values were calculated by drawing a curve contacting the hills and a curve contacting the valleys in the above-mentioned wavelength range and averaging the value of the curve contacting the hills and the value of the curve contacting the valleys at 800 nm wavelength and the thus obtained average values were used as the total reflectivity and the irregular reflectivity values.

Consequently, the water content was $5.0 \times 10^{-3}$ $mol/cm^3$, the electric resistance 0.50 $\Omega cm^2$, the total reflectivity 92%, and the irregular reflectivity 79% and they are sufficient values for a substrate for solar cells.

Example 2

After a zinc oxide thin film was deposited in the same manner as Example 1, each substrate was set in a portable electric furnace (AFM-10, manufactured by Asahi Rika Manufacturing), heated at a set temperature of 400° C. for 5 seconds, and taken out and then the water content, the electric resistance, and the reflectivity were measured.

Consequently, the water content was $4.2 \times 10^{-3}$ $mol/cm^3$, the electric resistance 0.51 $\Omega cm^2$, the total reflectivity 93%, and the irregular reflectivity 79% and they are sufficient values for a substrate for solar cells.

Example 3

After a zinc oxide thin film was deposited in the same manner as Example 1, each substrate was set in a portable electric furnace (AFM-10, manufactured by Asahi Rika Manufacturing), heated at a set temperature of 200° C. for 40 seconds, and taken out and then the water content, the electric resistance, and the reflectivity were measured.

Consequently, the water content was $5.5 \times 10^{-3}$ $mol/cm^3$, the electric resistance 3.1 $\Omega cm^2$, the total reflectivity 93%, and the irregular reflectivity 78%. Although the electric resistance value is slightly higher as compared with those of Example 1 and Example 2 and is the upper limit for a substrate for solar cells, they are satisfactory values for practical use without any problems.

Example 4

A 0.15 mm-thick SUS 430 (with 2D surface) sheet was cut into 5 cm-square pieces. A 800 nm-thick silver film was formed on each piece at 350° C. and a constant electric current of 0.3 A in argon atmosphere of 0.399 Pa (3.0 mTorr) by a sputtering apparatus (SBH-2206DE, manufactured by ULVAC).

Successively, oxygen was introduced to adjust the partial pressure of oxygen to be 30% and a 1.2 µm-thick zinc oxide thin film was formed at 350° C. and a constant electric current of 0.5 A in the argon-oxygen mixed atmosphere of 0.466 Pa (3.5 mTorr) and then the water content, the electric resistance, and the reflectivity were measured.

Consequently, the water content was $1.11 \times 10^{-3}$ $mol/cm^3$, the electric resistance 0.52 $\Omega cm^2$, the total reflectivity 92%, and the irregular reflectivity 74% and they are sufficient values for a substrate for solar cells.

Comparative Example 1

After a zinc oxide thin film was deposited in the same manner as Example 1, each substrate was taken out without being dried by heating and then the water content, the electric resistance, and the reflectivity were measured.

Consequently, the water content was $8.1 \times 10^{-3}$ mol/cm$^3$ and the electric resistance was 3.5 to 20.3 Ωcm$^2$, which was high and unstable, and thus they were improper for substrates for solar cells.

Example 5

A semiconductor layer, a transparent conductive layer, and a current collecting layer were successively formed on each of five substrates produced in Examples 1 to 4 and Comparative Example 1.

In this case, as semiconductor layers, a 10 nm-thick n-type a-Si layer was formed in the zinc oxide thin film side using SiH$_4$, PH$_3$, and H$_2$ as raw material gases by applying an electric power and successively a 500 nm-thick i-type a-SiGe layer using SiH$_4$, GeH$_4$, and H$_2$ and a 10 nm-thick p-type μc-Si layer using SiH$_4$, BF$_3$, and H$_2$ are formed to produce photovoltaic elements comprising nip semiconductor layers. Incidentally, the film formation temperature of the n-type a-Si layer was set to be 200° C.

As a transparent conductive layer, ITO was formed by an evaporation method and as the current collecting layer, metals of Cr and successively Au, were evaporated. The relative comparison results of the characteristics of the solar cells (i.e., the relationship between the water content and the solar cell characteristics) obtained at this time are shown in Table 2.

The following are made clear from Table 2.

The series resistance of the solar cells are varied depending on the water content in each zinc oxide thin film. In the case of Example 3, the series resistance is increased by about 10%, however the photoelectric conversion efficiency is scarcely decreased and it causes no problem. On the other hand, as is the case with Comparative Example 1, when the water content increases up to $8.1 \times 10^{-3}$ mol/cm$^3$, the series resistance abruptly doubles itself to significantly decrease the conversion efficiency.

As is the case with Example 4, when the water content in the zinc oxide thin film is as low as $1.11 \times 10^{-3}$ mol/cm$^3$, the short circuit current decreases slightly and the conversion efficiency decreases to the extent to which no problem takes place for the practical use. That is, a zinc oxide thin film with a small water content is insufficient in the surface unevenness and the irregular reflectivity is low as compared with those of Examples 1 to 3.

Next, in the same conditions as those of Example 5, solar cells were formed while the n-type a-Si layer formation temperature was set to be 250° C. and in this case, the solar cell produced using the substrate of Example 3 showed a lower conversion efficiency of 95. Further, visual observation revealed that the zinc oxide film was colored blackish. That is supposedly attributed to the effect of the isolation of bound water from the zinc oxide film during the n-type layer formation.

Similarly, when solar cells were formed while the n-type a-Si layer formation temperature was varied to 300° C. and 350° C., the solar cell produced using the substrate of Example 3 showed a conversion efficiency of 90 for a 300° C. sample and 80 for a 350° C. sample. Further, the solar cell produced using the substrate of Example 1 showed a conversion efficiency of 97 for a 350° C. sample. In the other cases, there was found no change in the conversion efficiency. On the other hand, solar cells were formed while the formation temperatures of the other semiconductor layers than the n-type a-Si layer were varied, there was found no change in the conversion efficiency.

It is seen from the above-mentioned results that the formation temperature of the semiconductor layer that is in contact with the zinc oxide film is preferably not higher than a temperature which is higher by 100° C. than the drying temperature of the zinc oxide film, and more preferably not higher than the drying temperature of the zinc oxide film.

Example 6

A 0.15 mm-thick SUS 430 (with 2D surface) sheet was cut into 5 cm-square pieces. A 200 nm-thick aluminum film was formed on each piece at 250° C. and a constant electric current of 0.25 A in argon atmosphere of 0.399 Pa (3.0 mTorr) and successively a 100 nm-thick zinc oxide thin film was formed at 250° C. and a constant electric current of 0.5 A in argon atmosphere of 0.399 Pa (3.0 mTorr) by a sputtering apparatus (SBH-2206DE, manufactured by ULVAC).

Next, an aqueous solution containing 0.2 mole of zinc nitrate and 0.1 g of dextrin dissolved in 1 litter of pure water was put in a beaker and heated to 82° C. Using each SUS/aluminum/zinc oxide substrate produced by the sputtering as a cathode and a 5 cm-square zinc plate with 4N-purity as an anode, a DC electric current of 180 mA was applied in a rated current mode to form a 2.0 μm-thick zinc oxide thin film on each SUS/aluminum/zinc oxide substrate. The distance between the substrate and the anode was set to be 2 cm. During the film formation, the aqueous solution was stirred by a magnetic stirrer.

Each sample obtained in such a manner was set in a portable electric furnace (AFM-10, manufactured by Asahi Rika Manufacturing), heated at a set temperature of 350° C. for 10 seconds, taken out, and the water content, the electric resistance, and the reflectivity were measured in the same manner as example 1.

Consequently, the water content was $3.2 \times 10^{-3}$ mol/cm$^3$, the electric resistance 0.50 Ωcm$^2$, the total reflectivity 64%, and the irregular reflectivity 50% and they are sufficient values for a substrate for solar cells.

Example 7

After a zinc oxide thin film was deposited by electrodeposition in the same manner as Example 6, each substrate was set in a portable electric furnace (AFM-10, manufactured by Asahi Rika Manufacturing), heated at a set temperature of 300° C. for 20 seconds, and taken out and then the water content, the electric resistance, and the reflectivity were measured.

Consequently, the water content was $2.7 \times 10^{-3}$ mol/cm$^3$, the electric resistance 0.44 Ωcm$^2$, the total reflectivity 64%, and the irregular reflectivity 49% and they are sufficient values for a substrate for solar cells.

Example 8

After a zinc oxide thin film was deposited by electrodeposition in the same manner as Example 6, each substrate was set in a portable electric furnace (AFM-10, manufactured by Asahi Rika Manufacturing), heated at a set temperature of 250° C. for 30 seconds, and taken out and then the water content, the electric resistance, and the reflectivity were measured.

Consequently, the water content was $5.5 \times 10^{-3}$ mol/cm$^3$, the electric resistance 3.4 Ωcm$^2$, the total reflectivity 65%, and the irregular reflectivity 50%. Although the electric resistance value is slightly high as compared with those of Example 1 and Example 2 and is the upper limit for a substrate for solar cells, they are satisfactory values for practical use without any problems.

Example 9

After a zinc oxide thin film was deposited in the same manner as Example 6, each substrate was set in a portable electric furnace (AFM-10, manufactured by Asahi Rika Manufacturing), heated at a set temperature of 500° C. for 20 seconds, and taken out and then the water content, the electric resistance, and the reflectivity were measured.

Consequently, the water content was $1.02 \times 10^{-3}$ mol/cm$^3$, the electric resistance 0.60 Ωcm$^2$, and the zinc oxide thin film surface looked slightly yellowish with visual observation. When the reflectivity was measured, the total reflectivity and the irregular reflectivity were both decreased slightly, by several %, within a range of relatively short wavelengths of 400 nm to 700 nm, however the obtained substrate was barely available as a substrate for solar cells.

This is supposedly attributed to that release of some of oxygen took place by the heating at as high temperature as 500° C. for a relatively long period of time, 20 seconds, to make the substrate yellowish.

Considering the above results and the results of other Examples, the drying temperature is preferably not lower than 200° C. and not higher than 400° C.

Comparative Example 2

After a zinc oxide thin film was deposited by electrodeposition in the same manner as Example 6, each substrate was taken out without being dried by heating and then the water content, the electric resistance, and the reflectivity were measured.

Consequently, the water content was $9.9 \times 10^{-3}$ mol/cm$^3$ and the electric resistance was 5.3 to 102 Ωcm$^2$, which was high and unstable, and thus they were improper for substrates for solar cells.

Example 10

A semiconductor layer, a transparent conductive layer, and a current collecting layer were successively formed on each of five substrates produced in Examples 6 to 9 and Comparative Example 2.

In this case, as semiconductor layers, a 10 nm-thick n-type a-Si layer was formed on the zinc oxide thin film using SiH$_4$, PH$_3$, and H$_2$ as raw material gases by applying an electric power, successively a 500 nm-thick i-type a-SiGe layer using SiH$_4$, GeH$_4$, and H$_2$ and a 10 nm-thick p-type μc-Si layer using SiH$_4$, BF$_3$, and H$_2$ are formed, and further in the same manner, nip-semiconductor layers comprising an a-SiGe layer were formed, and furthermore, nip-semiconductor layers comprising an a-Si layer were formed to produce triple-cell-type photovoltaic elements. The formation temperature of the n-type a-Si layer formed at first was set to be 250° C.

As a transparent conductive layer, ITO was formed by an evaporation method and as the current collecting layer, metals of Cr and successively Au, were evaporated. The relative comparison results of the characteristics of the solar cells (i.e., the relationship between the water content and the solar cell characteristics) obtained at this time are shown in Table 3.

The following are made clear from Table 3.

The series resistance of the solar cells are varied depending on the water content, except that in Example 9. That is supposedly attributed to that the aluminum surface was oxidized to some degree and the resistance slightly increased owing to the drying temperature as high as 500° C.

In the case of Example 8, the series resistance increases by about 10%, however the conversion efficiency scarcely decreases and it causes no problem. On the other hand, as is the case with Comparative Example 2, when the water content is increased up to $9.9 \times 10^{-3}$ mol/cm$^3$, the series resistance abruptly becomes 2.5 times to significantly decrease the conversion efficiency.

In the case of example 9, the conversion efficiency is slightly decreased owing to the decrease of the short circuit current. In comparison of Q values (the quantum efficiency) of these samples and the samples of Example 5, the Q value of the middle cell (the second nip-semiconductor layer) of the triple cells is slightly decreased within a range of wavelength of 600 to 700 nm. That is supposedly attributed to the decrease of the reflectivity of each substrate within the range of wavelength of 400 to 700 nm.

Next, when solar cells were produced while the formation temperature of the first n-type layer was set to be 350° C. in the same conditions as those of Example 10, the solar cells formed using the substrates produced in Examples 7 and 8 showed conversion efficiencies of 98 and 95, respectively. Further, visual observation of these samples revealed that the zinc oxide thin film was colored blackish. That is supposedly attributed to the effect that the bound water in the zinc oxide films was released during the n-type layer formation.

Similarly, when solar cells were formed while the n-type layer formation temperature was varied to 400° C., the solar cells produced using the substrates of Example 6, Example 7 and Example 8 showed conversion efficiencies of 99, 97 and 89, respectively.

One of the reasons for the results that the solar cells produced using the substrate of Example 7 did not show a large change in the conversion efficiency for the cases of 350° C. and 400° C. is considered to be that the absolute amount of water originally contained in the zinc oxide thin film is small.

It is seen from the above-mentioned results that the content of water in the zinc oxide film is more preferably $5.0 \times 10^{-3}$ mol/cm$^3$ or less.

Example 11

Semiconductor layers similar to those of Example 5 were deposited on substrates for solar cells produced by Examples 1 to 4, Examples 6 to 9, and Comparative Examples 1, 2 and at the time of forming transparent conductive layers, 0.25 cm$^2$ masks were used to produce 20 solar cells on the respective substrates and their survival percentage (%) were compared and the results are shown in Table 4.

With any samples, the survival percentage of the solar cells are sufficiently high for practical use of solar cells. However, when more carefully examined, in the case of Example 4 where the water content was slightly small as $1.11 \times 10^{-3}$ mol/cm$^3$, as compared with those of others, the survival percentage was slightly low. On the other hand, in other cases where water was contained to a certain extent, it is believed that the solar cells each have a proper resistance and hardly cause shunt. Although it is supposed that some substance moves along grain boundaries to cause electric conduction, the reason for the above described proper resistance is supposedly that existence of water in the grain boundaries makes the substance difficult to move and consequently improves the environmental resistance.

However, the result that the survival percentage for Example 9 with the water content of $1.02 \times 10^{-3}$ mol/cm$^3$ smaller than that for Example 4 is higher than the survival percentage for Example 4 is seemingly attributed to that since the drying temperature at the time of substrate formation was, as described above, as high as 500° C., the aluminum surface was oxidized to some extent to slightly increase the resistance, whereby shunt became difficult to take place to some extent.

The high survival percentages of Comparative Examples 1 and 2 were supposedly attributed to high resistances owing to the excess water incorporation.

Example 12

A 0.15 mm-thick SUS 430 (with 2D surface) sheet was cut into 5 cm-square pieces. A 200 nm-thick silver film was formed on each piece at 350° C. and a constant electric current of 0.3 A in argon atmosphere of 0.399 Pa (3.0 mTorr) and successively 100 nm-thick zinc oxide thin film was formed at 350° C. and a constant electric current of 0.5 A in argon atmosphere of 0.399 Pa (3.0 mTorr) by a sputtering apparatus (SBH-2206DE, manufactured by ULVAC).

Next, an aqueous solution containing 0.2 mole of zinc nitrate and 0.1 g of dextrin dissolved in 1 litter of pure water was put in a beaker and heated to 82° C. Using each SUS/silver/zinc oxide substrate produced by the sputtering as a cathode and a 5 cm-square zinc plate with 4N-purity as an anode, a DC electric current of 180 mA was applied in a constant current mode to form a 2.0 $\mu$m-thick zinc oxide thin film on each SUS/silver/zinc oxide substrate. The distance between the substrate and the anode was set to be 2 cm. During the film formation, the aqueous solution was stirred by a magnetic stirrer.

Each sample obtained in such a manner was set in a portable electric furnace (AFM-10, manufactured by Asahi Rika Manufacturing), heated at a set temperature of 300° C. for 10 seconds, and subjected to water content measurement to find the water content to be $4.9 \times 10^{-3}$ mol/cm$^3$. Using the samples obtained in such a manner and the samples of Example 1, a cross hatch test according to JIS standard (cross cut tape test) and surface observation by SEM were carried out.

The results of the cross hatch test were 8 points for the samples of Example 1 and 10 point for the samples of Example 12. Both were found to have no problem for used in solar cells, however the adhesion was higher in the samples of Example 12 in which the 100 nm-thick zinc oxide film was previously deposited by sputtering.

Next, as the results of the SEM observation, the growth direction of the crystal grains was found partially converged in the case of Example 1 in which the film formation was carried out directly on the silver surface, whereas the growth direction of the crystal grains was at random in the case of Example 12 in which the 100 nm-thick zinc oxide film was previously deposited by sputtering. As a result, although samples can be used as substrates for solar cells without any problems in both cases, it is implied that the samples of Example 12 are probable to be used rather advantageously in terms of the uniformity of the characteristics for enlargement of the surface area in consideration of industrial productivity.

Similarly to the above-mentioned Examples, when zinc oxide films were formed by sputtering in an atmosphere containing water with the amount of water in the atmosphere being variously changed and solar cells were produced using the thus obtained substrates, those solar cells which had a zinc oxide film with a water content of the film of not less than $4.0 \times 10^{-4}$ mol/cm$^3$ and not more than $7.5 \times 10^{-3}$ mol/cm$^3$ showed good characteristics.

As described above, a substrate for solar cells containing water to a certain extent, specifically $7.5 \times 10^{-3}$ mol/cm$^3$ or less, preferably not less than $4.0 \times 10^{-4}$ mol/cm$^3$ but no more than $7.5 \times 10^{-3}$ mol/cm$^3$, is optimum from a comprehensive point of view.

The substrate for solar cells of the invention has a proper resistance value for solar cells owing to the water content in a certain level and thus can make shunt difficult to occur. It is supposed that although some substance moves along grain boundaries to provide electric conduction, the existence of water in the grain boundaries makes the substance difficult to move and consequently improves the environmental resistance.

Further, owing to the water content in a certain level, presence of those just like grain boundaries owing to the existence of water in a number larger than the number of those existing in a ordinary zinc oxide thin film formed by a common process such as sputtering, so that the rugged shapes seemingly composed of rocks are possibly formed. For that, a high irregular reflectivity was obtained and as a result, a high Jsc was obtained.

Further, especially, in a zinc oxide thin film formed by electrodeposition method based on the electrochemical reactions in an aqueous solution, owing to the oxygen contained in water, the film becomes slightly oxygen-rich as compared with a zinc oxide film formed by a common process such as sputtering, so that the total reflectivity is slightly increased and the efficiency is increased.

Further, since the above-described zinc oxide thin film is slightly oxygen-rich relative to zinc, the resulting substrate is chemically stable even in the reducing atmosphere at the time of formation of a solar cell (semiconductor films) and the electric and the optical characteristics are not deteriorated.

Further, especially, previous formation of a single layer of a zinc oxide film as an underlying layer makes formation of a uniform zinc oxide thin film with a high adhesion possible and a substrate for solar cells excellent for industrial use can be obtained.

Further, by controlling the temperature during the drying after zinc oxide film formation in an aqueous solution to be not lower than a temperature that is lower by 100° C. than the temperature during the semiconductor layer formation immediately succeeding the drying, more preferably not lower than the temperature during the semiconductor layer formation, it is possible to prevent bound water in the zinc oxide film from adversely affecting on the semiconductor layer formation step.

TABLE 1

| Sample | Forming Conditions | Water Content (mol/cm³) | Electrical Resistance (Ωcm²) | Total Reflectivity (%) | Irregular Reflectivity (%) |
|---|---|---|---|---|---|
| A | Sputtering/ No water | $(0.18–0.35) \times 10^{-3}$ | 0.20–0.32 | 92 | 68 |
| B | Sputtering/ Water Partial Pressure 5% | $(0.67–1.01) \times 10^{-3}$ | 0.35–0.50 | 92 | 73 |
| C | Sputtering/ Water Partial Pressure 10% | $(0.68–1.09) \times 10^{-3}$ | 0.32–0.53 | 93 | 72 |
| D | Sputtering/ Water Partial Pressure 15% | $(0.70–1.13) \times 10^{-3}$ | 0.38–0.55 | 93 | 75 |
| E | Sputtering/ Water Partial Pressure 30% | $(0.75–1.21) \times 10^{-3}$ | 0.46–0.58 | 93 | 76 |
| F | Electro-deposition/ No drying | $0.77–1.08 \times 10^{-2}$ | 2.6–95.5 | 93 | 78 |
| G | Electro-deposition/ Drying Condition 1 | $0.70–0.96 \times 10^{-2}$ | 2.8–18.2 | 93 | 79 |
| H | Electro-deposition/ Drying Condition 2 | $0.55–0.73 \times 10^{-2}$ | 3.0–3.4 | 93 | 79 |
| I | Electro-deposition/ Drying Condition 3 | $0.44–0.63 \times 10^{-2}$ | 0.50–0.55 | 93 | 78 |
| J | Electro-deposition/ Drying Condition 4 | $0.24–0.32 \times 10^{-2}$ | 0.45–0.48 | 93 | 79 |
| K | Electro-deposition/ Drying Condition 5 | $(0.78–1.11) \times 10^{-3}$ | 0.45–0.60 | 93 | 77 |
| L | Sputtering/ Water Partial Pressure 0.1% | $(0.38–0.46) \times 10^{-3}$ | 0.25–0.42 | 92 | 70 |

TABLE 2

| Substrate for Solar Cell | Water Content (mol/cm³) | Conversion Efficiency* | Short Circuit Current* (Jsc) | Series Resistance* (Rs) |
|---|---|---|---|---|
| Example 1 | $5.0 \times 10^{-3}$ | 100 | 100 | 100 |
| Example 2 | $4.2 \times 10^{-3}$ | 100 | 101 | 99 |
| Example 3 | $5.5 \times 10^{-3}$ | 98 | 98 | 110 |
| Example 4 | $1.11 \times 10^{-3}$ | 96 | 97 | 98 |
| Comparative Example 1 | $8.1 \times 10^{-3}$ | 88 | 95 | 200 |

*Relative values normalized with the values for Example 1 being 100

TABLE 3

| Substrate for Solar Cell | Water Content (mol/cm³) | Conversion Efficiency* | Short Circuit Current* (Jsc) | Series Resistance* (Rs) |
|---|---|---|---|---|
| Example 6 | $3.2 \times 10^{-3}$ | 100 | 100 | 100 |
| Example 7 | $2.7 \times 10^{-3}$ | 101 | 101 | 99 |
| Example 8 | $5.5 \times 10^{-3}$ | 99 | 98 | 112 |
| Example 9 | $1.02 \times 10^{-3}$ | 97 | 96 | 102 |
| Comparative Example 2 | $9.9 \times 10^{-3}$ | 87 | 93 | 250 |

*Relative values normalized with the values for Example 6 being 100

TABLE 4

| | Ex. 1 | Ex. 2 | Ex. 3 | Ex. 4 | Comp. Ex. 1 | Ex. 6 | Ex. 7 | Ex. 8 | Ex. 9 | Comp. Ex. 2 |
|---|---|---|---|---|---|---|---|---|---|---|
| Survival Percentage (%) | 100 | 95 | 100 | 90 | 100 | 95 | 95 | 100 | 95 | 100 |

What is claimed is:

1. A substrate for a solar cell comprising a support having a metal surface and a zinc oxide film formed on the metal surface,
wherein the zinc oxide film has a water content of not less than $4.0 \times 10^{-4}$ mol/cm³ and not more than $7.5 \times 10^{-3}$ mol/cm³, and wherein the metal surface comprises silver or a silver alloy.

2. The substrate according to claim 1, wherein the zinc oxide film is formed by electrodeposition using an electrochemical reaction in an aqueous solution.

3. The substrate according to claim 1, wherein the zinc oxide film is formed by sputtering in an atmosphere comprising water.

4. The substrate according to claim 1, wherein the zinc oxide film is comprised of a plurality of layers.

5. The substrate according to claim 1, wherein the film has a water content of not less than $1.0 \times 10^{-3}$ mol/cm$^3$ and not more than $5.0 \times 10^{-3}$ mol/cm$^3$.

6. A solar cell comprising the substrate for a solar cell as set forth in claim 1 and a semiconductor layer provided on the substrate.

7. A process of producing a solar cell comprising the steps of:

forming a zinc oxide film on a support using an aqueous solution;

drying the zinc oxide film at a first temperature; and forming a semiconductor layer on the zinc oxide film at a second temperature immediately after the drying step, wherein the second temperature is not higher than a temperature that is 100° C. higher than the first temperature.

8. The process according to claim 7, wherein the second temperature is not higher than the first temperature.

9. The process according to claim 7, wherein the first temperature is not lower than 200° C. and not higher than 400° C.

* * * * *

UNITED STATES PATENT AND TRADEMARK OFFICE
CERTIFICATE OF CORRECTION

PATENT NO. : 6,660,931 B2
DATED : December 9, 2003
INVENTOR(S) : Noboru Toyama et al.

It is certified that error appears in the above-identified patent and that said Letters Patent is hereby corrected as shown below:

Column 5,
Line 37, "little b" should read -- little by --.

Column 6,
Line 23, "later" should read -- latter --.
Line 44, "an zinc" should read -- a zinc --.
Line 55, "being stirring" should read -- being stirred --.

Column 7,
Line 33, "litter" should read -- liter --.

Column 10,
Line 17, "litter" should read -- liter --.

Column 13,
Line 45, "used" should read -- use --.

Signed and Sealed this

Tenth Day of August, 2004

JON W. DUDAS
*Acting Director of the United States Patent and Trademark Office*